(12) United States Patent
Mika et al.

(10) Patent No.: US 6,894,546 B2
(45) Date of Patent: May 17, 2005

(54) NOISE REDUCTION FOR PHASE LOCKED LOOP

(75) Inventors: Benedykt Mika, Albuquerque, NM (US); Alma Stephanson Anderson, Rio Rancho, NM (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 62 days.

(21) Appl. No.: 10/283,938

(22) Filed: Oct. 30, 2002

(65) Prior Publication Data

US 2004/0085105 A1 May 6, 2004

(51) Int. Cl.[7] .................................................. H03L 7/06
(52) U.S. Cl. ....................................... 327/157; 327/156
(58) Field of Search ................................ 327/551, 552, 327/156, 157, 148, 537

(56) References Cited

U.S. PATENT DOCUMENTS

| | | | | |
|---|---|---|---|---|
| 5,121,085 A | * | 6/1992 | Brown ......................... | 331/17 |
| 5,382,923 A | * | 1/1995 | Shimada et al. ............ | 327/157 |
| 5,631,587 A | * | 5/1997 | Co et al. .................... | 327/107 |
| 5,767,714 A | * | 6/1998 | Kotani et al. ............... | 327/156 |
| 5,821,789 A | * | 10/1998 | Lee ............................. | 327/156 |
| 6,320,435 B1 | * | 11/2001 | Tanimoto .................... | 327/156 |

* cited by examiner

*Primary Examiner*—Dinh T. Le

(57) ABSTRACT

A dual signal path provides enhanced noise cancellation for phase locked loop applications. According to various aspects of the invention, dual charge pumps are used to split the phase locked loop signal into dual signal paths, wherein each path carries an information signal with an injected noise component. The dual signal paths are arranged to maintain the magnitude and phase characteristics of the injected noise component. Filter blocks process the signals, retaining the injected noise component. The filtered signals are coupled to the input of an adder circuit where the filtered signals are subtracted. Because each filtered signal contains the injected noise component, the subtraction operation effectively cancels the injected noise component from the filtered signals.

16 Claims, 4 Drawing Sheets

NOISE REDUCTION FOR PHASE LOCKED LOOP

FIELD OF THE INVENTION

The present invention is directed to electronic circuits and, more particularly, to noise reduction in signal processing circuits applicable to phase locked loop systems.

BACKGROUND

The phase locked loop concept has been used in a wide variety of applications including frequency synthesis, frequency multiplication, clock generation, and tone decoding. A phase locked loop is an oscillator that uses a feedback loop to lock the output frequency to an input reference. Phase locked loops can be used to generate stable frequency output frequencies from fixed low frequency reference signals.

Typically, a phase locked loop is a mixed signal application incorporating both analog and digital components. The basic operation involves comparing the phase of an oscillator output to the phase of a reference input signal using a phase detector. A signal representing the phase difference provides the control for the oscillator. A feedback path to the input of the phase detector ensures that the controlled oscillator output is "locked" to the frequency of the reference input signal.

Almost every electronic application is plagued by noise, unwanted signals that obscure the information carrying signal. Phase locked loop circuits are also sensitive to noise, particularly phase noise that causes errors or jitter in the frequency of the output signal. Noise may appear at the input of the phase locked loop and noise may be generated within the components of the phase locked loop as well.

When phase locked loops are used as frequency synthesizer components in RF communication systems, for example, noise associated with the frequency synthesizer directly degrades the performance of the entire system. In addition, noise in phase locked loops affects the timing margins of the system design. Phase locked loop communication applications sensitive to noise may include those involving long distances or a series of cascaded phase locked loops. In these applications, controlling the noise introduced in each phase locked loop stage may be especially critical.

As system speeds increase, more stringent noise requirements are imposed on phase locked loop circuits because higher frequency operations cannot tolerate the same amount of noise and associated jitter. These and other difficulties present challenges to the implementation of noise control in phase locked loop circuits.

SUMMARY

Various aspects of the present invention involve noise reduction in signal processing circuits. In one example embodiment, the signal processing circuit involves dual path signal processing for noise reduction and has been found to be particularly useful in connection with phase locked loop systems. More specifically, various aspects of the present invention involve splitting a signal path into dual signal paths using a pair of charge pumps, processing the split signal, and canceling the noise at the output.

According to one embodiment of the invention, a phase locked loop filter includes a signal splitter configured to split a signal path into dual signal paths. The dual signal paths carry signals having an injected noise component. A signal processor is coupled to the signal splitter through the dual signal paths. The signal processor processes the signals and retains the injected noise component. An adder coupled to the outputs of the signal processor cancels the injected noise component by subtraction of the processed signals.

According to various aspects of the invention, the dual signal paths are arranged to retain the magnitude and phase characteristics of the injected noise. In one example, the signal splitter is configured as a pair of charge pumps that maintain similar electrical characteristics of the dual paths. According to another example embodiment, the signal processor is arranged to include a low pass filters coupled to the charge pumps and arranged to filter the signals while retaining the injected noise component. The outputs of the low pass filters are coupled to an adder for subtracting one signal from the other signal. Because each signal contains the injected noise component substantially similar in magnitude and phase, the signal subtraction effectively cancels the noise from the processed signals.

According to another embodiment, a phase locked loop includes dual signal paths configured to generate signals proportional to a phase difference between a reference signal and an output signal. The dual signal paths are further arranged to cancel an injected noise component from the signals to produce a noise canceled signal. The phase locked loop includes a phase detector configured to detect a phase difference between the output signal and a reference signal and supply the phase difference signal to the dual signal paths. An oscillator responsive to the noise canceled signal is coupled to the dual signal paths. The oscillator produces an output signal having a frequency in phase with the reference signal.

In various aspects, the dual signal paths include a signal splitter circuit, which may be arranged as dual charge pumps coupled to the phase detector. The dual charge pumps are coupled to a pair of filter circuits. The charge pumps and filter circuits are arranged to maintain the magnitude and phase characteristics of the injected noise component. An adder coupled to the filter circuits subtracts the filtered signals. Because each filtered signal contains the injected noise component, the signal subtraction effectively cancels the noise.

In yet another embodiment of the invention, a method for noise reduction involves splitting a signal path of a phased locked loop to produce dual signal paths carrying signal having an injected noise component. The signals are processed in the dual signal paths, the processed signals retaining the injected noise component. The injected noise component is canceled by subtracting the processed signals.

Another embodiment of the invention involves a system for noise reduction including means for means for splitting a signal path of a phase locked loop to produce dual signal paths carrying signals having an injected noise component, means for processing the signals, the processed signals retaining the injected noise component, and means for canceling the injected noise component by subtracting the processed signals.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

BRIEF DESCRIPTION OF THE DRAWINGS

The invention may be more completely understood in consideration of the following detailed description of vari

Figure 1:
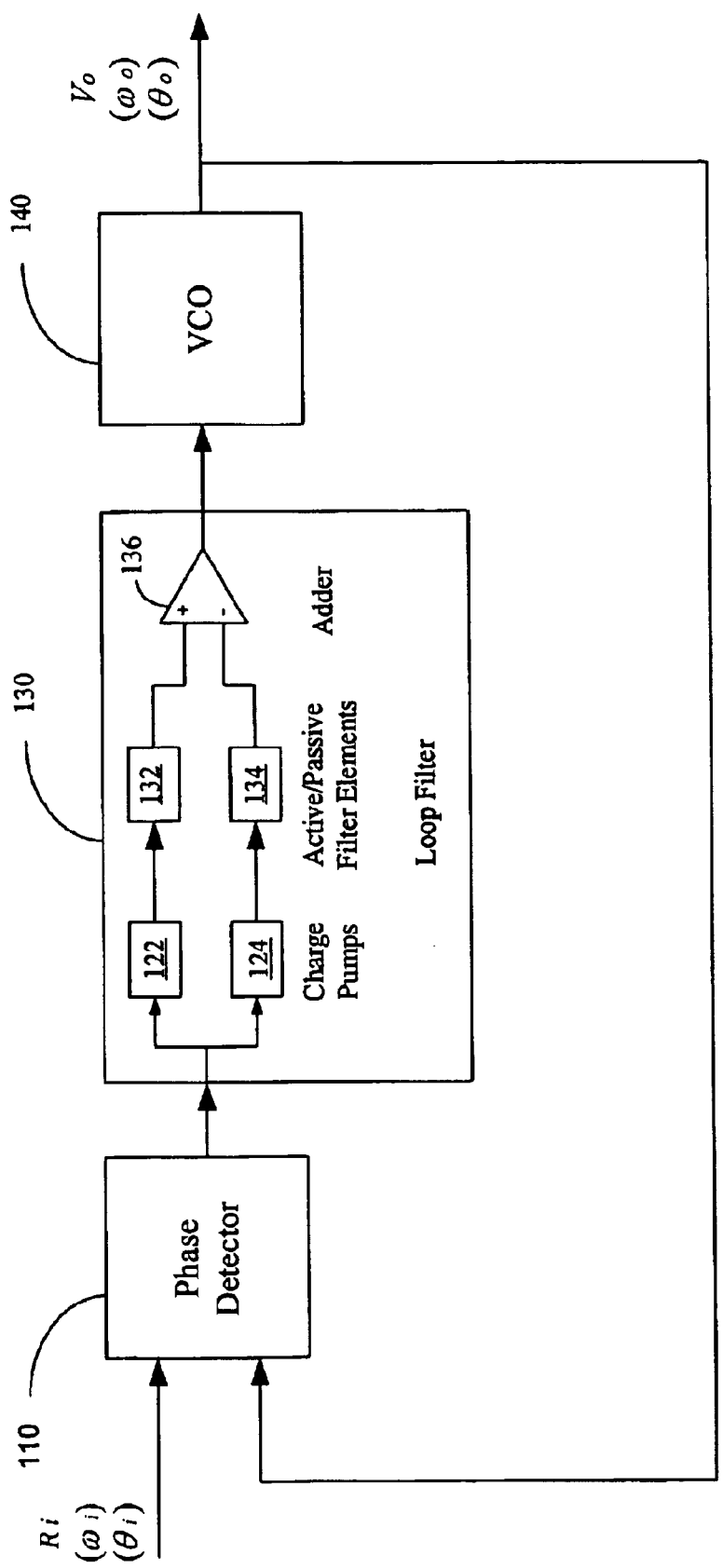
- FIG. 1 is a block diagram of a phase locked loop circuit arrangement in accordance with an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

The present invention is believed to be applicable to a variety of circuits and approaches involving and/or benefiting from noise reduction. Various embodiments of the invention have been found to be particularly useful in connection with phase locked loop systems. While the present invention is not necessarily limited to such applications, an appreciation of various aspects of the invention is best gained through a discussion of examples in such an environment.

Noise has a variety of sources and can be characterized by amplitude, phase and frequency. The operation of a phase locked loop is may be significantly degraded by phase noise that causes errors or jitter in the frequency of the output signal.

The transient power supply noise generated by digital circuits or microprocessors is a major source of phase locked loop jitter. The noise generated by digital signals may be injected into the signal path by coupling through the power supply rails, for example. The internal noise on the power supplies may be difficult to manage and control. Its magnitude, frequency, and phase are dependent on the broadband impedance of the internal power supply rails and their resonant frequencies.

One source of error in circuits using FET switches may be related to charge injection noise transferred from the controlling gate to the signal carrying channel. The full swing transitions at the gate are coupled capacitively to the drain and source. The total charge injected is independent of transition time and is dependent on the gate channel characteristics and the circuit impedance.

According to example embodiments of the present invention, a phase locked loop filter is adapted for reducing noise injected into the loop signal path. For example, the noise may be injected into the signal path through the power supply rails and control logic as discussed above.

The phase locked loop filter with noise reduction splits the signal into a dual signal path. Each signal path carries a signal having an injected noise source. The signal paths are adapted to maintain the characteristics of the noise, including amplitude, frequency, and phase characteristics. The signals of each path are applied to signal processing circuitry and the processed signals are subtracted. Because each processed signal contains the injected noise component, the signal subtraction effectively cancels the noise from the processed signals.

A phased locked loop incorporating noise reduction, in accordance with an embodiment of the invention, includes a phase detector, loop filter with noise reduction, and an oscillator. The loop filter includes signal splitter circuitry for splitting the loop into two paths. In one example, the signal splitter circuitry is implemented using a dual charge pump arrangement coupled to the phase detector. Output signals from the phase detector are coupled to both charge pumps, effectively splitting the signal from the phase detector into two signals at the inputs of the charge pumps. Signal processing circuitry, for example, dual low pass filter circuitry, is coupled to the charge pumps. Noise injected into the dual signal paths is maintained in each of the signal paths with respect to the magnitude and phase characteristics of the noise. Noise reduction circuitry, for example, a precision linear adder, is used to cancel the injected noise component from the signals carried by the dual signal paths. The resulting noise-canceled signal is coupled to the input of the oscillator.

FIG. 1 is a block diagram of a phase locked loop including a loop filter with noise reduction according to an embodiment of the present invention. According to this embodiment, a phase detector 110 compares two signals, Ri and Vo, having frequency and phase characteristics, $\omega_i$, $\theta_i$ and $\omega_o$, $\theta_o$, respectively. The phase detector 110 compares $\theta_i$ and $\theta_o$, and develops a signal proportional to the phase difference between Ri and Vo. The phase detector 110 converts the input phase difference into a series of variable width pulses representing a phase difference signal.

The phase locked loop phase difference signal is applied to the inputs of a pair of charge pumps 122, 124 in a loop filter 130. The phase difference signal generated by the phase detector 110 is used to control current pulses generated by the charge pumps 122, 124. Each charge pump 122, 124 uses a matched current source and current sink. Controlled by the phase difference signals produced by the phase detector 110, each charge pump 122, 124 produces an output current signal that acts as a current source or sink for the low pass filter circuits 132, 134 in the loop filter 130. The low pass filters 132, 134 integrate the pulsed output current from the charge pumps to produce a smoothed voltage signal representative of the phase difference.

Noise may be injected into each of the dual signal paths through various sources, including coupling through the power supply rails. The electrical conditions of the dual signal paths are configured so that the magnitude and phase characteristics of the injected noise component are maintained in each of the signal paths. Thus, each of the smoothed voltage signals at the output of each of the low pass filter circuits 132, 134, include an injected noise component having substantially similar phase and magnitude characteristics.

The voltage signals generated by the low pass filter circuits 132, 134 are applied to the inputs of an adder 136 to cause one low pass filter 134 output to be subtracted from the other low pass filter 132 output. Because each of the low pass filter output signals includes a substantially equivalent injected noise component, the subtraction operation performed in the adder circuitry 136 cancels the noise from the resultant signal.

The signal output from the adder 136, which may include an additional processing stage, represents the output of the loop filter 130. The loop filter output is coupled to a voltage controlled oscillator 140 that generates an output signal with a frequency controlled by the loop filter output. The voltage controlled oscillator output signal is feed back to the input of the phase detector. In a common application, a modulo-n counter may be coupled in the feed back path between the voltage controlled oscillator 140 and the phase detector 110, thus generating a multiple of the input reference signal frequency. This configuration provides the basic technique used for frequency synthesizers, for example.

Figure 2:
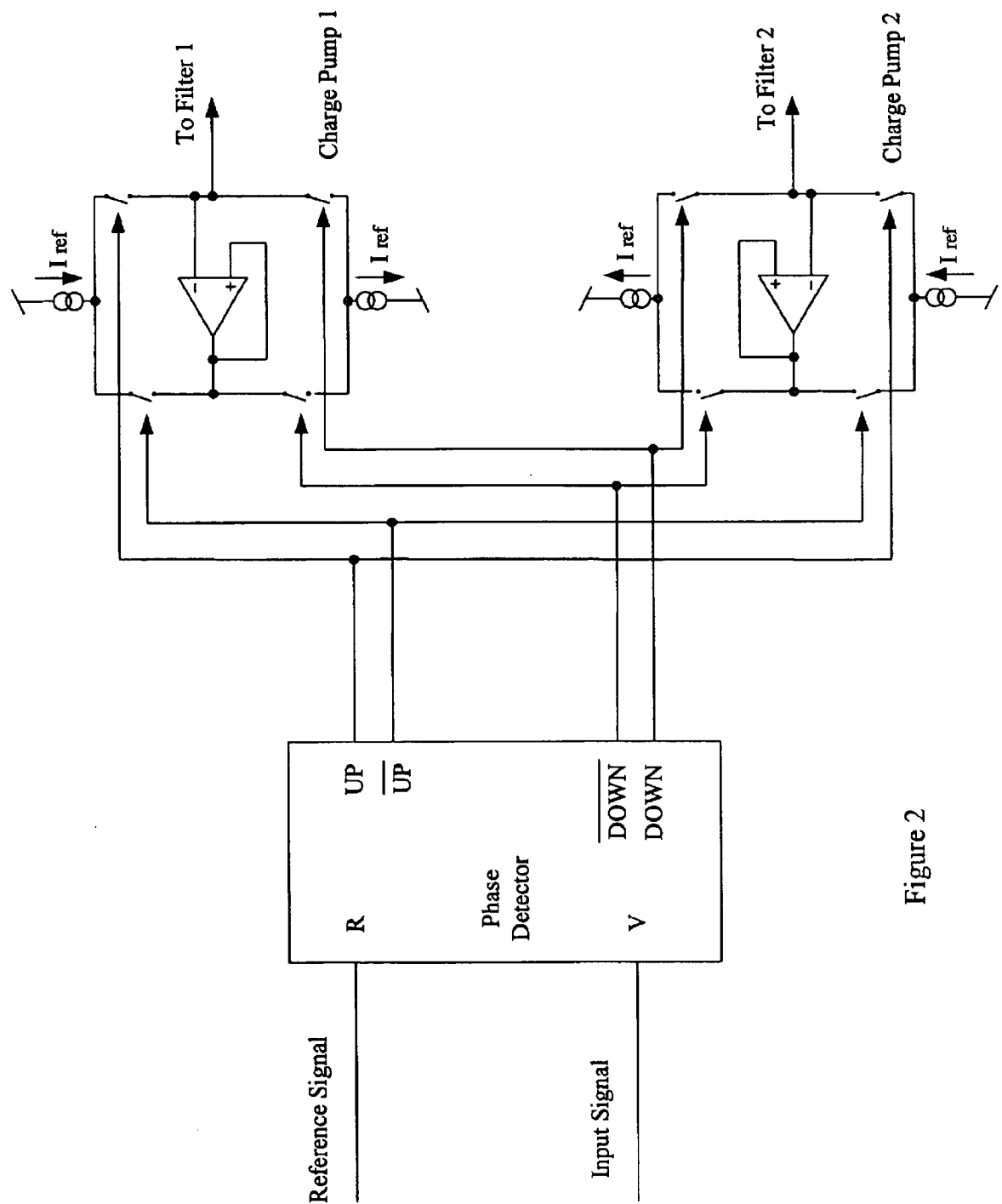
FIG. 2 is a block diagram illustrating splitting the signal path from a phase detector using a pair of charge pumps in accordance with an embodiment of the invention.

A conceptual diagram of a technique for splitting the current path of the phase locked loop is illustrated in FIG. 2. The UP and DOWN outputs of a phase detector control the switches of the charge pumps 1 and 2. The charge pumps produce output current pulses related to the phase difference between the reference signal R and signal V detected by the phase detector. The output signals from the charge pumps include an injected noise component, for example, noise injected from the power supply rails or from switching transients of the digital circuits, in addition to the information signal corresponding to the phase difference.

Figure 3:
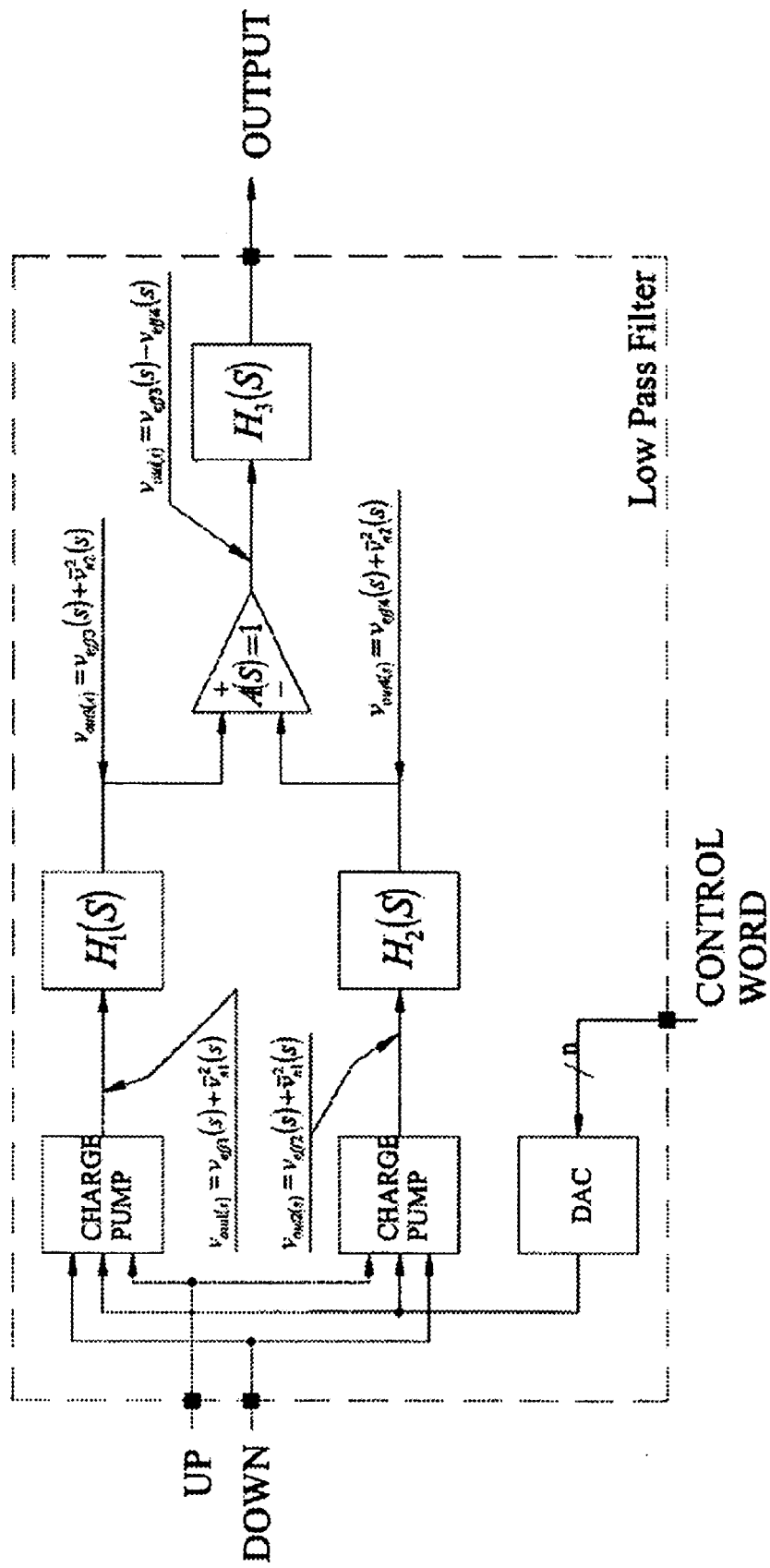
FIG. 3 is a block diagram representing a signal processing circuit in accordance with an embodiment of the invention.

The outputs of charge pumps 1 and 2 are coupled to filters 1 and 2. A conceptual block diagram of the charge pump and filter circuitry is illustrated in FIG. 3. As previously discussed, charge pumps 1 and 2 are coupled to the UP and DOWN outputs of a phase detector. The signals at the outputs of the charge pumps include the information signals in addition to an injected noise signal. Thus, the outputs of charge pump 1 and charge pump 2 may be expressed as Equations [1] and [2], respectively.

$$v_{out1}(s) = v_{eff1}(s) + \bar{v}_{n1}^2(s) \quad [1]$$

$$v_{out2}(s) = v_{eff2}(s) + \bar{v}_{n1}^2(s) \quad [2]$$

where $v_{eff1}(s)$ is the effective information signal at the output of the first charge pump 310, $v_{eff2}(s)$ is the effective information signal at the output of the second charge pump 315, and $\bar{v}_{n1}^2(s)$ is the rms injected noise component superimposed on the effective information signals.

The charge pump outputs are coupled to the filter blocks $H_1(s)$ and $H_2(s)$. The filter blocks $H_1(s)$ and $H_2(s)$ are arranged to generate a smooth voltage signal from the current pulses output from the dual charge pumps. The signals at the outputs of $H_1(s)$ and $H_2(s)$ represent the phase difference between a feedback signal V and a reference signal R, as previously discussed in connection with FIG. 2. The filter blocks $H_1(s)$ and $H_2(s)$ act on $v_{out1}(s)$ and $v_{out2}(s)$, respectively, to filter the information signal, while maintaining substantially similar magnitude and phase characteristics of the injected noise component incorporated into each signal path. The outputs of the filter blocks $H_1(s)$ and $H_2(s)$ are given by equations [3] and [4], respectively.

$$v_{out3}(s) = v_{eff3}(s) + \bar{v}_{n2}^2(s) \quad [3]$$

$$v_{out4}(s) = v_{eff4}(s) + \bar{v}_{n2}^2(s) \quad [4]$$

where $v_{eff3}(s)$ is the effective information signal at the output of $H_1(s)$, $v_{eff4}(s)$ is the effective information signal at the output of $H_2(s)$, and $\bar{v}_{n2}^2(s)$ is the rms injected noise component superimposed on the effective information signals.

The outputs of filter blocks $H_1(s)$ and $H_2(s)$ are applied to the inputs of a precision linear adder circuit, A(s)=1, where the filtered output from $H_2(s)$ is subtracted from the filtered output from $H_1(s)$. The rms injected noise component affecting each signal path is canceled by the subtraction operation as expressed in equation [5]:

$$v_{out3}(s) - v_{out4}(s) = v_{eff3}(s) - v_{eff4}(s). \quad [5]$$

A final filter block $H_3(s)$ may be applied to the reunited signal. The final filter block $H_3(s)$ may be, for example, a passive low pass filter to minimize noise coupling through the power supply. The output of the final filter block $H_3(s)$ is coupled to the input of a voltage controlled oscillator.

Figure 4:
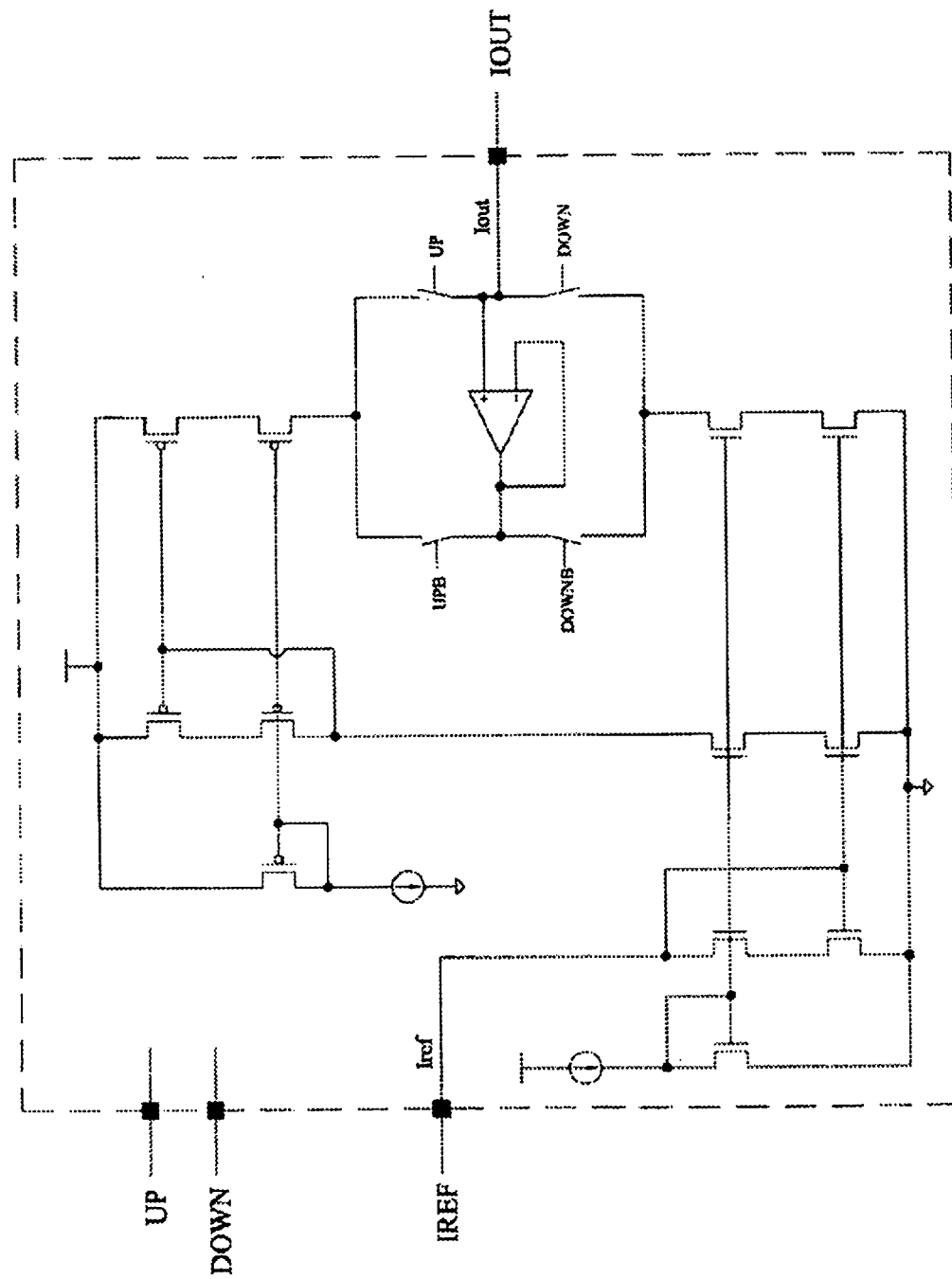
FIG. 4 is a simplified circuit diagram of a charge pump in accordance with an embodiment of the invention.

FIG. 4 is a simplified schematic diagram illustrating the charge pump circuitry in accordance with an embodiment of the invention. As previously discussed, the charge pumps are used to split the signal path such that the output impedance, charge injection noise characteristics, and transfer function from the power supply rails to the signal path are substantially similar. Each of the charge pumps may include, for example, symmetrical cascode current sources that cooperate with an operational transconductance amplifier (OTA) circuit arranged in a follower configuration. The charge pumps are arranged so that substantially the same electrical conditions are maintained in each charge pump. This configuration operates to retain the same characteristics of the injected noise component in each signal path. Thus, the injected noise component is presented unaltered to the inputs of the adder and can be effectively canceled at the adder stage. The charge pump currents may be controlled by an N bit digital to analog converter (DAC) to adapt desired phase locked loop properties for frequency synthesis operations.

The present invention should not be considered limited to the particular examples described above. For example, a variety of circuit arrangements can be implemented to arrive at the same result. Various modifications, equivalent processes, as well as numerous structures to which the present invention may be applicable fall within the scope of the present invention, as fairly set forth in the appended claims. Each charge pump uses symmetrical cascode current sources

What is claimed is:

1. A phase locked loop filter, comprising:
signal splitter circuitry configured to split a signal path into dual signal paths, the dual signal paths carrying signals having an injected noise component;
processing circuitry coupled to the signal splitter through the dual signal paths, the processing circuitry configured to process the signals and retain the injected noise component; and
noise reduction circuitry coupled to the processing circuitry, the noise reduction circuitry configured to cancel the injected noise component of the processed signals to produce a noise canceled signal.

2. The filter of claim 1, wherein the dual signal paths are configured to retain the magnitude and phase characteristics of the injected noise component.

3. The filter of claim 1, wherein the dual signal paths are configured to have similar output impedances.

4. The filter of claim 1, wherein the dual signal paths are configured to have similar charge injection noise characteristics.

5. The filter of claim 1, wherein the signal splitter circuitry comprises dual charge pumps.

6. The device of claim 5, wherein an output current of each of the dual charge pumps is controlled by a digital to analog converter signal.

7. The device of claim 1, wherein the signal processing circuitry comprises dual low pass filters.

8. The device of claim 1, wherein the noise reduction circuitry comprises adder circuitry.

9. The device of claim 1, further comprising a filter coupled to the noise reduction circuitry for filtering the noise canceled signal.

10. A noise reduction method, comprising:

splitting a signal path of a phase locked loop to produce dual signal paths, the dual signal paths carrying signals having an injected noise component;

processing the signals, the processed signals retaining the injected noise component; and canceling the injected noise component by subtracting the processed signals.

11. The method of claim 10, wherein the signals represent a phase difference between an output of the phase locked loop and a reference signal.

12. The method of claim 10, wherein splitting a phase locked loop signal path comprises splitting a phase locked loop signal path using dual charge pumps.

13. The method of claim 10, wherein processing the signals comprises low pass filtering the signals.

14. The method of claim 10, wherein retaining the injected noise component comprises retaining the magnitude and phase characteristics of the injected noise component.

15. A phase locked loop system, comprising:

means for splitting a signal path of the phased locked loop to produce dual signal paths, the dual signal paths carrying signals having an injected noise component;

means for processing the signals, the processed signals retaining the injected noise component; and means for canceling the injected noise component by subtracting the processed signals.

16. A phase locked loop system, comprising:

means for splitting a phase locked loop signal path into dual signal paths carrying signals having an injected noise component;

means for processing the signals having the injected noise component; and means for canceling the injected noise component.

* * * * *